(12) United States Patent
Montanini et al.

(10) Patent No.: US 8,486,741 B2
(45) Date of Patent: Jul. 16, 2013

(54) PROCESS FOR ETCHING TRENCHES IN AN INTEGRATED OPTICAL DEVICE

(75) Inventors: Pietro Montanini, Milan (IT); Giovanna Germani, Bareggio (IT); Ilaria Gelmi, Albiate (IT); Marta Mottura, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 13/481,680

(22) Filed: May 25, 2012

(65) Prior Publication Data

US 2012/0228260 A1 Sep. 13, 2012

Related U.S. Application Data

(62) Division of application No. 11/230,292, filed on Sep. 19, 2005, now abandoned.

(30) Foreign Application Priority Data

Sep. 17, 2005 (IT) .............................. RM2004A0445

(51) Int. Cl.
  *H01L 21/00* (2006.01)
  *H01L 21/311* (2006.01)
  *H01L 21/302* (2006.01)
(52) U.S. Cl.
  USPC ............. 438/31; 438/700; 438/712; 438/713; 438/717; 438/945; 438/950; 257/E21.218; 257/E21.232; 216/64

(58) Field of Classification Search
  USPC ................... 438/31, 700, 712, 713, 717, 945, 438/950; 257/E21.218, E21.232; 216/64
  See application file for complete search history.

(56) References Cited

U.S. PATENT DOCUMENTS

| | | | | |
|---|---|---|---|---|
| 4,889,828 A | * | 12/1989 | Jeuch | 438/426 |
| 5,163,220 A | * | 11/1992 | Zeto et al. | 29/846 |
| 5,210,801 A | * | 5/1993 | Fournier et al. | 385/14 |
| 5,741,741 A | * | 4/1998 | Tseng | 438/637 |
| 5,783,844 A | | 7/1998 | Kobayashi et al. | |
| 5,841,930 A | | 11/1998 | Kovacic et al. | |
| 5,895,255 A | * | 4/1999 | Tsuchiaki | 438/427 |
| 6,309,918 B1 | * | 10/2001 | Huang et al. | 438/173 |
| 6,621,972 B2 | | 9/2003 | Kimerling et al. | |
| 6,920,257 B1 | * | 7/2005 | Mekis et al. | 385/14 |
| 7,099,360 B2 | * | 8/2006 | Bhowmik et al. | 372/29.021 |
| 7,934,455 B2 | * | 5/2011 | Winter | 102/517 |
| 2002/0076161 A1 | * | 6/2002 | Hirabayashi et al. | 385/40 |
| 2004/0028312 A1 | * | 2/2004 | Park et al. | 385/14 |

* cited by examiner

*Primary Examiner* — Charles Garber
*Assistant Examiner* — Ron Pompey
(74) *Attorney, Agent, or Firm* — Graybeal Jackson LLP

(57) ABSTRACT

The described process allows trenches to be etched in a structure comprising a support substrate and a multilayer, formed on the substrate, for the definition of wave guides of an integrated optical device and comprises a selective plasma attack in the multilayer through a masking structure that leaves uncovered areas of the multilayer corresponding to the trenches to be etched. Such a masking structure is obtained by forming a mask of metallic material on the multilayer that leaves uncovered the areas corresponding to the trenches to be etched and forming a mask of non-metallic material, for example photoresist, on it that leaves uncovered regions comprising at least part of the areas and an edge portion of the mask of metallic material.

20 Claims, 4 Drawing Sheets

PROCESS FOR ETCHING TRENCHES IN AN INTEGRATED OPTICAL DEVICE

PRIORITY CLAIM

The present application is a Divisional of U.S. patent application Ser. No. 11/230,292, filed Sep. 19, 2005, now abandoned; which application claims priority to Italian Patent Application No. RM2004A000445, filed Sep. 17, 2004; all of the foregoing applications are incorporated herein by reference in their entireties.

TECHNICAL FIELD

The present disclosure refers generally to processes for manufacturing integrated optical devices and, more specifically, to a process for etching trenches in an integrated optical device.

BACKGROUND

Integrated optical devices are used, as known, in communications networks that use light signals for the transmission of information. The most common optical devices are modulators, attenuators and interferometers.

FIG. 1 of the attached drawings shows an integrated optical device 1 in an initial manufacturing step. In order to form the represented structure, a first silicon dioxide ($SiO_2$) layer 3 is formed on a silicon support substrate 2, usually by deposition, said coating layer or lower cladding, doped with impurities of a type and concentration such as to obtain a predetermined refraction index $n_{cladding}$. A layer 4 is deposited on the layer 3, said core layer, again made from silicon dioxide, but doped with a type and concentration of impurities different to those of the underlying layer so that the refraction index of the core is greater than the refraction index of the cladding ($n_{core} > n_{cladding}$). The core layer is subjected to a known photolithographic process, after which the plot of the cores of the wave guides of the designed optical device is obtained. The last step necessary for the formation of the optical circuit is the deposition of a coating layer or upper cladding 5. Of course, this layer covers the top and side of each track of the plot formed by the core layer. The upper layer 5 is preferably made from silicon dioxide doped with the same type and the same concentration of impurities with which the lower coating layer is doped, so as to have the same refraction index $n_{cladding}$. Under the condition $n_{core} > n_{cladding}$ the light propagates substantially inside the optical paths defined by the cores.

In a standard manufacturing process of an integrated optical device the subsequent step is the formation of further structures 6 of the integrated optical device. An example of these structures is shown in FIG. 2, which also shows a masking layer 7 with an opening for the etching of a trench.

The last step of the process is the formation of trenches in the multilayer consisting of the layers of oxide 3, 4 and 5.

A trench can have different functions: for example, it can make a physical insulation, both from the optical point of view and from the thermal point of view, between two optical paths that are adjacent or in any case very close to each other, or else it can thermally insulate one or more optical paths from heat sources present on the device itself or it can be used to make an optical switch. In this case the trench is filled with a medium the characteristics of which, in terms of refraction index and propagation constant, can be modified so as to be selectively equal to or less than those of the cores of the wave guides of the interrupted optical path. In this way it is possible to close or open the path of the light signal.

The trench that one wishes to make typically must cut the entire thickness of the multilayer of oxide that, as stated, comprises three layers: the lower and upper coating layers 3 and 5, both typically having a thickness of about 16 µm, and the core layer 4, on the other hand, having a thickness that can be between 4 µm and 8 µm. In total, therefore, the depth that typically must be reached with the etch is about 36-40 µm. Typically, for these depth values (a few tens of µm) a trench is considered deep; on the other hand, for depths of a few µm a trench is considered not very deep, i.e., shallow.

For the etching of a trench, currently techniques are used that foresee the deposition on the multilayer of a layer of a material resistant to the attack of the oxide, the definition on it of a mask 7, like the one shown in FIG. 2, which leaves uncovered the area 8 of the multilayer corresponding to the mouth of the trench, and an anisotropic attack for the removal of the oxide through the non-masked areas. This step is typically carried out with a dry attack through plasma (plasma dry etching). Plasma techniques allow a highly anisotropic attack to be carried out, i.e. having an attack speed in the vertical direction, or more precisely perpendicular to the surface to be attacked, much greater than the attack speed in the lateral direction. This allows high-resolution images to be transferred even when the layer of material to be removed has a high thickness. Currently, for the attack through plasma both old-style machines that carry out low-density plasma attacks, and modern-style machines that carry out high-density plasma attacks, are used. The difference between the two types of attack lies in the amount of species contained in the plasma that react with the material to be removed. The low-density plasma attack is substantially of the chemical type: a chemical reaction between the chemical reactants contained in the plasma and the material of the multilayer causes the removal of material from the multilayer itself. The high-density plasma attack can, on the other hand, be considered both chemical and physical: combined with a chemical reaction there is an actual abrasion of the oxide due to particles present in the plasma that bombard the surface to be removed. In the same time period a high-density plasma attack reaches a greater depth than a low-density plasma attack. Old-style machines are more common and easier to find on the market, and therefore they have a relatively low cost. Modern-style machines, being technologically more advanced, have a greater cost and are put onto the market by few suppliers.

As stated previously, the attack step of the multilayer through plasma is preceded by a process for the definition of a mask that leaves unprotected the areas in which the trenches are to be etched. The mask typically must keep its profile as unaltered as possible under the action of the plasma and typically must have high selectivity.

If the material constituting the masking layer is such that the profile of the mask during the attack step remains unaltered, the attack shall be substantially vertical and shall allow the desired resolution to be obtained. Here, resolution means the measurement of the fidelity of transfer of the image from the mask to the attacked material. The trenches shall thus have substantially vertical walls, i.e. with inclination of at least 88° with respect to the surface plane of the silicon substrate.

The selectivity is the ratio between the attack speeds on different materials: in this case it is the ratio between the attack speed of the oxide of the multilayer and the attack speed of the masking material. In common processes this ratio can be between 5:1 and 8:1. This means that the attack of the oxide is from 5 to 8 times quicker than the attack of the masking material. Ratios of this magnitude are typical of masks of low selectivity. For greater ratios (even of 10:1, 20:1) a mask is considered to have good selectivity; for ratios of 100:1 a mask can be considered to have infinite selectivity.

In standard processes the masks used are of photosensitive organic polymeric material, commonly known as photoresist. This type of material is not very resistant to the action of the attack through plasma, be it high or low density so that it reacts chemically with the plasma. In particular, during the attack step it deteriorates considerably at the edges that define the unprotected areas to be etched. For example, if in the structure of FIG. 2 the masking layer 7 is considered as a photoresist layer, this phenomenon of erosion of the edges, or "tip" effect, progressively modifies the profile of the mask to such a point that in the oxide a trench with vertical walls is not obtained but rather, as represented in FIG. 3, an incision 9 with oblique or in any case irregular walls. Typically, this drawback is limited by increasing the thickness of the masking layer. Unfortunately, current materials and equipment typically do not allow photoresist thicknesses of any more than 6-7 μm to be obtained. Moreover, during the definition of a mask in a layer of photoresist of such a thickness, it is often difficult to obtain sharp and regular profiles of the edges, but usually the profile extends beyond the desired limits. The result is a reduction in the area of the multilayer exposed to the attack, for which reason the design specifications relative to the size of the trenches may not be respected.

As an alternative to organic masks, so-called hard masks can be used, for example masks made from metallic material. A metal mask 10, like the one represented in FIG. 4, ensures substantially infinite selectivity (attack speed ratio 100:1) and greater protection against the action of the plasma since the chemical composition of the metal does not react with the chemical attack agents. Therefore, the metal mask 10 keeps its profile substantially unaltered during the attack.

In the case in which the area of the multilayer not protected by the mask of metallic material is a very small percentage of the area of the device (roughly less than 25%), a large amount of metallic material is exposed to the attack. It follows from this that numerous metallic particles are gradually removed from the mask and find themselves free in the plasma itself, for which reason they slow down the action of the plasma. This effect, known as "resputtering", often does not allow the attack to be completed up to the desired depth. Moreover, a large amount of metal exposed directly to the plasma may become electrically charged during the attack, and this can cause further drawbacks from the electrical point of view. The trenches obtained, like the trench 11 shown in FIG. 4, consequently have imperfections on the side walls, especially in the deepest zone in which the attack may not be completed.

SUMMARY

An embodiment of the present disclosure is a process for etching deep trenches in the multilayer of oxide of an integrated optical device that allows the drawbacks outlined above to be avoided.

BRIEF DESCRIPTION OF THE DRAWINGS

The disclosure shall become clearer from the following detailed description of two embodiments thereof given as an example with reference to the attached drawings, in which the figures are section views of structures of integrated optical devices in different manufacturing stages. In particular.

DETAILED DESCRIPTION

Figure 1:
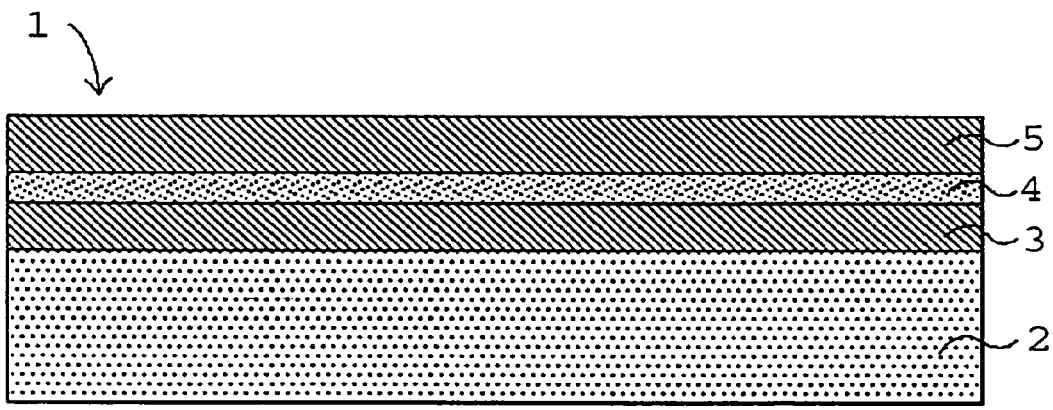
FIG. 1 illustrates an initial step of the manufacturing process of an integrated optical device according to the prior art.
Figure 2:
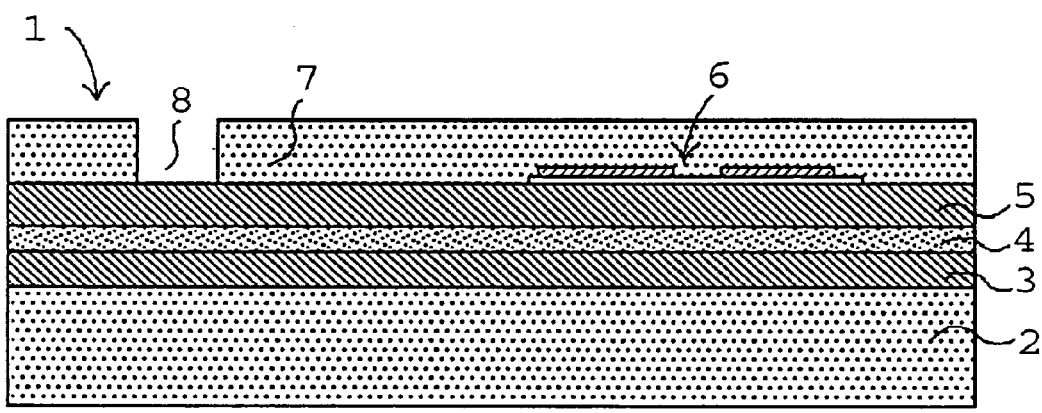
FIG. 2 shows a structure with a mask of non-metallic material, which leaves unprotected an area corresponding to the mouth of a trench, obtained in a step of a process according to the prior art.
Figure 3:
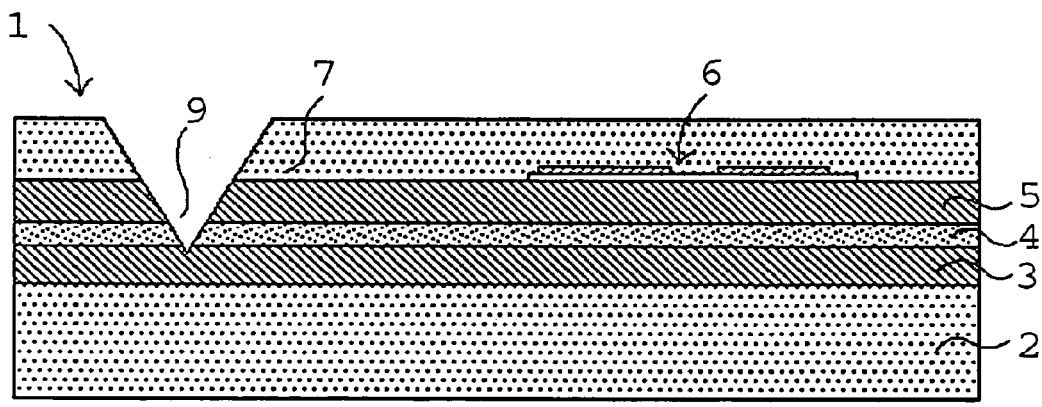
FIG. 3 illustrates the result of a plasma attack step on the structure of FIG. 2 in a process according to the prior art.
Figure 4:
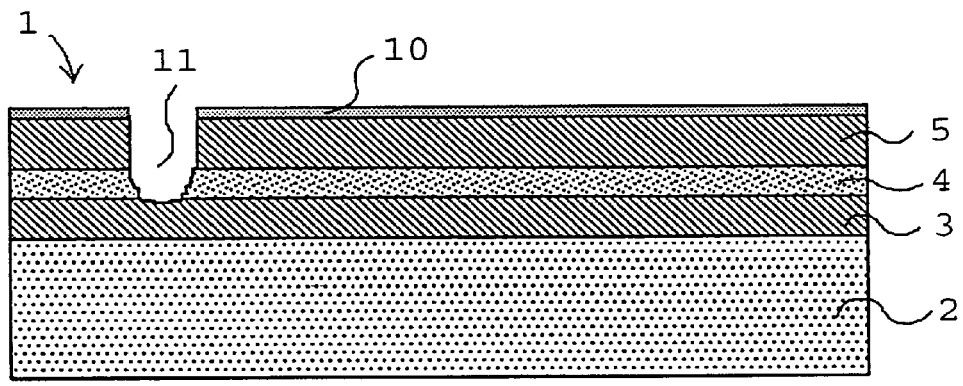
FIG. 4 shows a structure with mask of metallic material after a plasma attack step in a process according to the prior art.

A process according to an embodiment of the disclosure foresees, like in the prior art described with reference to FIG. 1, the formation on a silicon substrate 2 of a multilayer of oxide comprising two coating layers 3 and 5 and an intermediate core layer 4. Before the deposition of the upper coating layer 5, the intermediate layer 4 is subjected to a photolithographic process to obtain the plot of the cores of the waves guides of the optical circuit.

Figure 5:
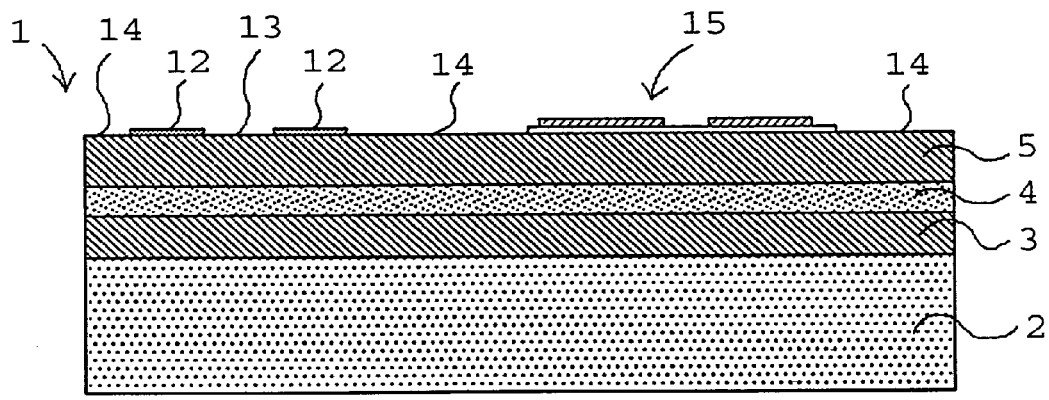
FIGS. 5, 6, 7 and 8 illustrate some intermediate steps of a process according to an embodiment of the disclosure.

As shown in FIG. 5, one proceeds to the deposition of a layer of metallic material and to the consequent definition of a metallic mask 12, the profile of which is such as to leave uncovered an area 13 of multilayer corresponding to a trench to be etched with a width, for example, of 15 μm. In particular, in this embodiment of the disclosure, the metallic mask 12 is substantially limited to framing the area 13 corresponding to the trench with a metallic strip with a width, for example, of 20 μm: therefore, on the multilayer there are other areas 14 not protected by the metallic material and not corresponding to trenches to be etched. Then, one proceeds to the steps of deposition and definition of possible structures 15 of the integrated optical device.

Figure 6:
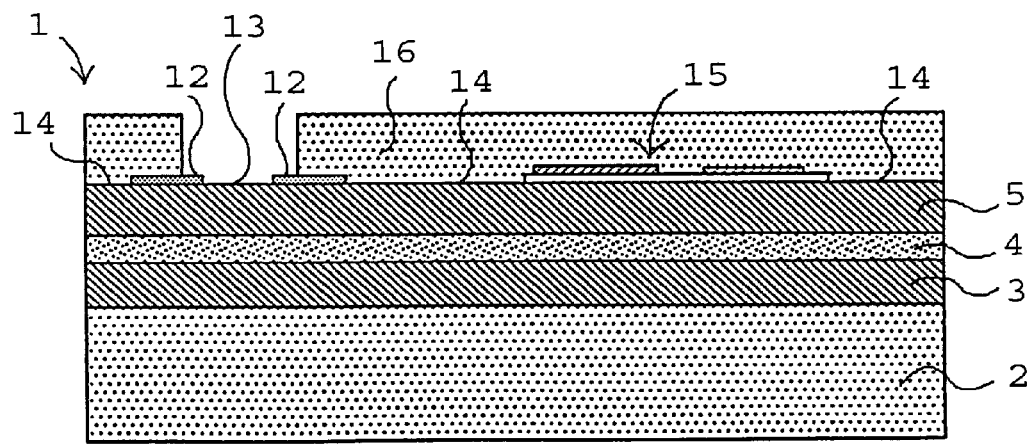

At this point, as shown in FIG. 6, a thick protective layer of non-metallic material, for example photoresist, is deposited and a mask 16 is defined in it. Preferably, the layer of photoresist is as thick as possible, even up to the maximum technological limit of about 7 μm. The mask 16 leaves uncovered a region substantially larger than the area 13 not protected by the metallic mask 12. Indeed, as can be seen, such a region comprises the area 13 and an edge portion of the metallic mask 12. This uncovered edge is at least wide enough to avoid problems due to alignment tolerances and irregularities of the profile of the mask 16. In particular, it should be noted that, with a layer of photoresist of such a thickness, a profile of the walls of the openings can be very irregular, faceted or even curved, for which reason, without this provision, there is the risk of the photoresist partially covering the area 13 left uncovered by the metallic mask 12. Therefore, the function of the mask of photoresist 16 is to cover most of the metallic masking layer, the areas 14 of the multilayer left uncovered by the metallic mask 12 and the structures 15 possibly deposited.

Figure 7:
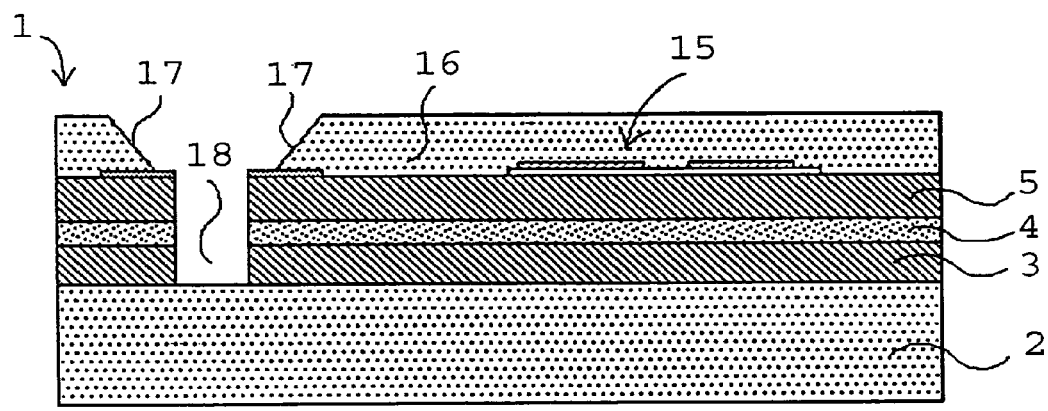

The next operation is an anisotropic attack preferably with high-density plasma. The "resputtering" effect shall be much less pronounced than that of the known process since no metallic part with the exception of the edge close to the area 13 is directly exposed to the attack. As can be seen in FIG. 7, at the edges of the openings of the mask of photoresist there will be the usual erosion effect of the edges 17, whereas, thanks to the metallic mask 12, the anisotropic attack shall proceed with high selectivity managing to etch a trench 18 that completely crosses the multilayer in its total depth keeping side walls vertical.

Figure 8:
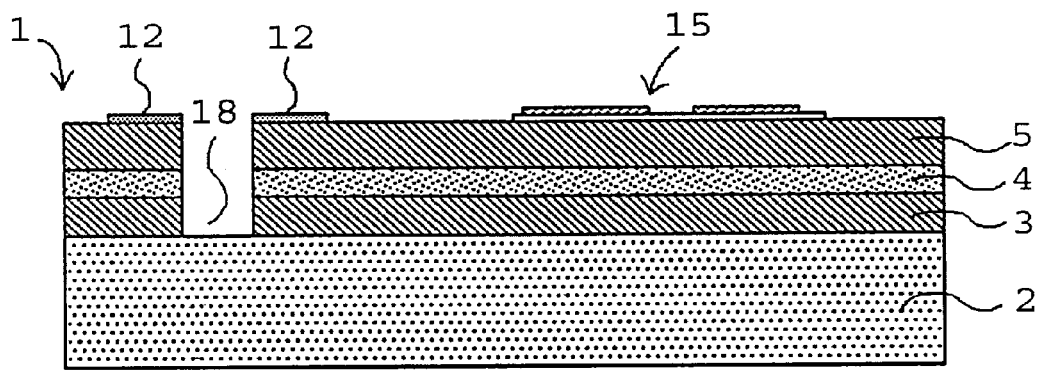
Figure 9:
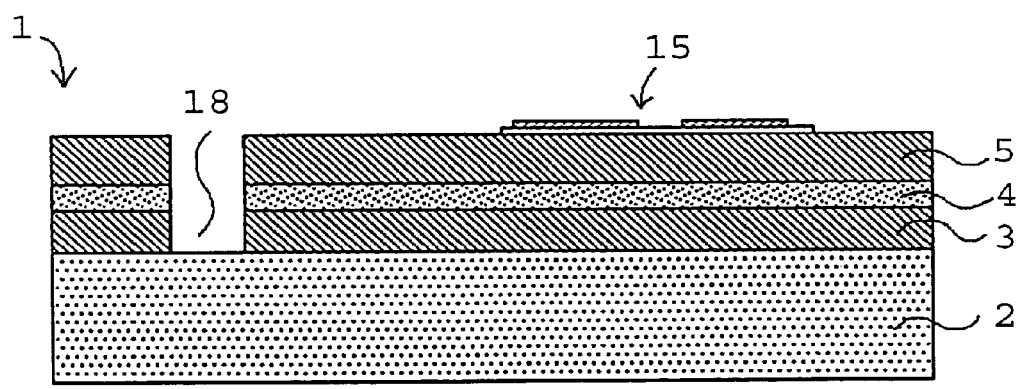
FIG. 9 shows the structure of an integrated optical device with trench obtained with a process according to an embodiment of the disclosure.

The last two steps of the process, after which the structures represented in FIGS. 8 and 9 are obtained, are the removal, with known techniques, of the mask of photoresist 16 and of the metallic mask 12, respectively.

Figure 10:
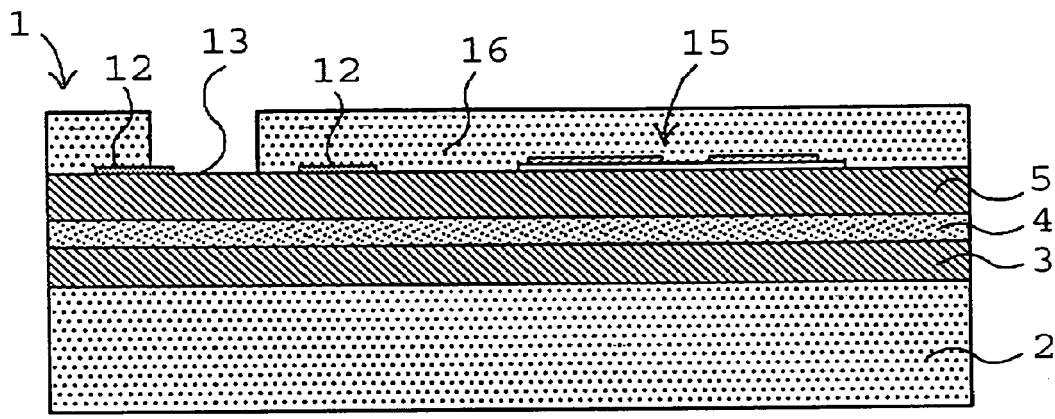
FIGS. 10 and 11 illustrate a variant of some intermediate steps of the process according to an embodiment of the disclosure.

A variant of the process according to an embodiment of the disclosure allows an asymmetrical trench to be etched into the multilayer, i.e. a trench that has, in the section view of the figures, on one side, a substantially vertical wall and on the opposite side a wall that is inclined, for example by 50°-60°, with respect to the plane of the multilayer. As can be seen in FIG. 10, after the intermediate step of definition of the mask of photoresist, the profile of the mask 16 leaves uncovered a portion of just one of the edges of the metallic mask 12 visible in the figure, in this case the edge to the left of the area 13 corresponding to the trench to be etched, whereas it totally covers the opposite edge to the right of the area 13, and in part such an area.

Figure 11:
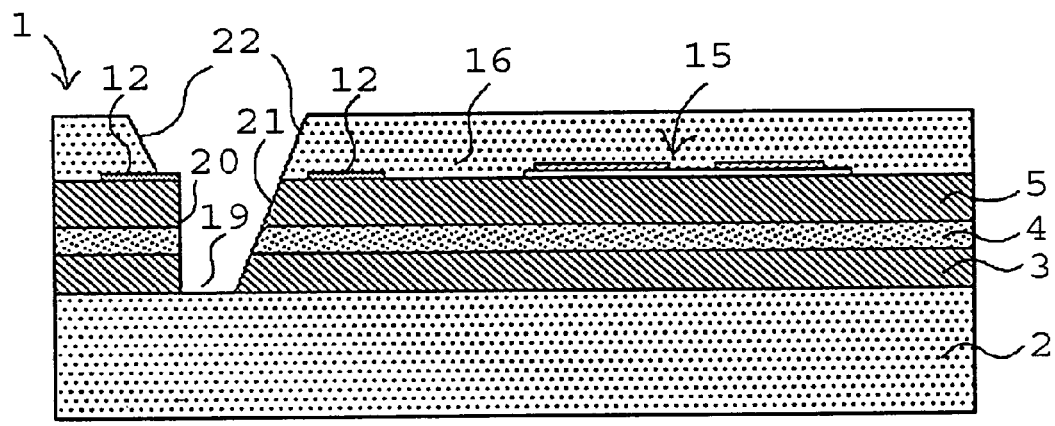

As can be seen in FIG. 11, the anisotropic attack shall proceed with high selectivity etching a trench 19 that completely crosses the multilayer in its total depth with the vertical side wall 20 on the left whereas on the right it shall have an oblique wall 21. The "resputtering" effect shall be much less pronounced both than that of the known process and even than that of the process described previously in conjunction with FIGS. 5-9 since the uncovered area of metal is also less than that of the previous example. The erosion effect of the edges (walls 22) is present, but it does not change the result of the process as far as the vertical wall 20 is concerned, as is also described for the previous case. However, such an effect is of operative importance to obtain the oblique wall 21.

Figure 12:
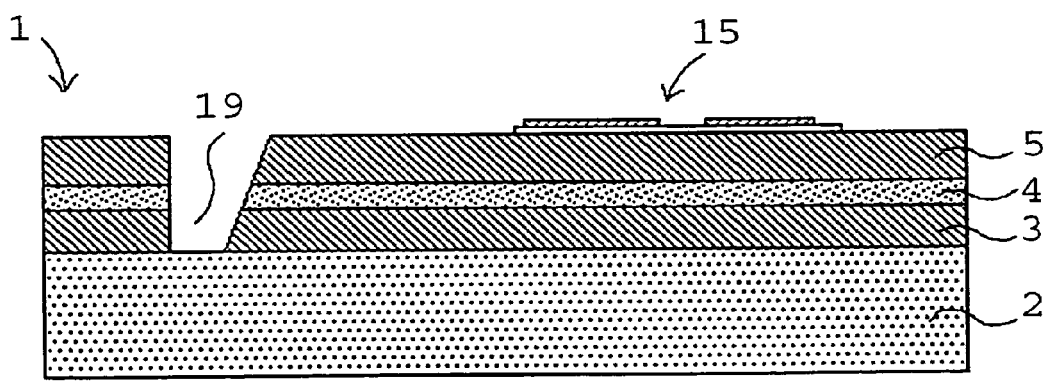
FIG. 12 shows the structure of an integrated optical device with trench obtained with a process according to an embodiment of the disclosure that includes the variant illustrated in FIGS. 10 and 11.

The last two steps of the process are the removal, with known techniques, of the mask of photoresist and of the metallic mask, respectively, and they allow the structure of FIG. 12 to be obtained.

As can easily be seen, the described processes allow trenches with vertical walls to be etched in the oxide avoiding the drawbacks of the prior art. In particular, these processes can be implemented also proceeding to a low-density plasma attack, thus allowing the use of old-style machines having low costs and greater availability, as explained previously.

An integrated circuit (IC) may incorporate one or more of the structures of FIGS. 5-12 and an electronic system, such as an optical communication system, may incorporate one or more of this type of IC.

What is claimed is:

1. Process for etching trenches in a structure comprising a support substrate and a multilayer, formed on the substrate, comprising a core layer and coating layers for the definition of wave guides of an integrated optical device, the process comprising:
   Implementing a selective plasma attack in the multilayer through a masking structure that leaves uncovered areas of the multilayer corresponding to the trenches to be etched asymmetrically;
   wherein the masking structure is obtained:
      forming a mask of metallic material on the multilayer that leaves uncovered the areas corresponding to the trenches to be etched; and
      forming a mask of non-metallic material that leaves uncovered regions comprising a portion of one edge of the mask of metallic material, wherein the one edge is on one of the sides of the areas corresponding to the trenches to be etched; and
      that leaves covered regions comprising the opposite edge of the mask of metallic material and at least part of the areas corresponding to the trenches to be etched.

2. Process for etching trenches according to claim 1, wherein forming the mask of non-metallic material leaves uncovered regions comprising the areas corresponding to the trenches to be etched and an edge portion of the mask of metallic material.

3. Process for etching trenches according to claim 1, wherein the mask of metallic material leaves uncovered further areas of the multilayer not corresponding to the trenches to be etched.

4. Process for etching trenches according to claim 1, wherein formation of the mask of non-metallic material is preceded by operations for the formation of other structures of the integrated optical device.

5. Process for etching trenches according to claim 1, wherein the non-metallic material comprises a photoresist.

6. Process for etching trenches according to claim 1, wherein the attack comprises a low-density plasma attack.

7. Process for etching trenches according to claim 1, wherein the attack comprises a high-density plasma attack.

8. A method, comprising:
   forming on a material a metallic first mask that exposes a region of the material;
   forming on the first mask a second mask that exposes a section of the region and a portion of the first mask that is contiguous with the section of the region and that covers a section of the region and the first mask that is contiguous with the opposite section of the region; and
   forming a trench in the exposed section of the material, the trench having a first trench wall that not parallel with a second trench wall.

9. The method of claim 8, further comprising:
   forming on a substrate a first optical layer having a first index of refraction;
   forming on the first layer a second optical layer having a second index of refraction; and
   forming on the second layer a third optical layer having a third index of refraction, the first, second, and third layers composing the material.

10. The method of claim 8, further comprising removing the first and second masks after forming the trench.

11. The method of claim 8 wherein forming the first mask comprises forming the first mask only within predetermined distance from a perimeter of the region.

12. The method of claim 8 wherein forming the second mask comprises forming the second mask such that the second mask exposes the entire region of the material and exposes a portion of the first mask that is contiguous with multiple sides of the region.

13. The method of claim 8 wherein forming the second mask comprises forming the second mask such that the second mask exposes a section that is smaller than the entire region of the material and exposes only a portion of the first mask that is contiguous with fewer than all sides of the section.

14. The method of claim 8 wherein forming the second mask comprises forming the second mask such that the second mask exposes a section that is smaller than the entire region of the material and exposes only a portion of the first mask that is contiguous with a single side of the section.

15. The method of claim 8 wherein forming the trench comprises anisotropically etching the exposed section of the material.

16. The method of claim 8 wherein forming the trench comprises plasma etching the exposed section of the material.

17. The method of claim 8 wherein forming the second mask comprises forming the second mask from a non-metallic material.

18. A method, comprising:
forming a first mask on a material;
forming a second mask on the first mask such that a region of the material is exposed, the exposed region bounded on one side by the first mask and the exposed region bounded on a different side by the second mask; and
forming a trench in the exposed region of the material.

19. The method of claim 18, further comprising:
forming on a substrate a first optical layer having a first index of refraction;
forming on the first layer a second optical layer having a second index of refraction; and
forming on the second layer a third optical layer having a third index of refraction, the first, second, and third layers composing the material.

20. The method of claim 18 wherein the first mask is formed from a metallic material and the second mask is formed from a photoresist material.

* * * * *

UNITED STATES PATENT AND TRADEMARK OFFICE
CERTIFICATE OF CORRECTION

PATENT NO. : 8,486,741 B2  
APPLICATION NO. : 13/481680  
DATED : July 16, 2013  
INVENTOR(S) : Pietro Montanini et al.

Page 1 of 1

It is certified that error appears in the above-identified patent and that said Letters Patent is hereby corrected as shown below:

Title page, item [30] Foreign Application Priority Data reading "Sept. 17, 2005", should read -Sept. 17, 2004-.

Signed and Sealed this
Twenty-fifth Day of February, 2014

Michelle K. Lee
*Deputy Director of the United States Patent and Trademark Office*